Figure 1:
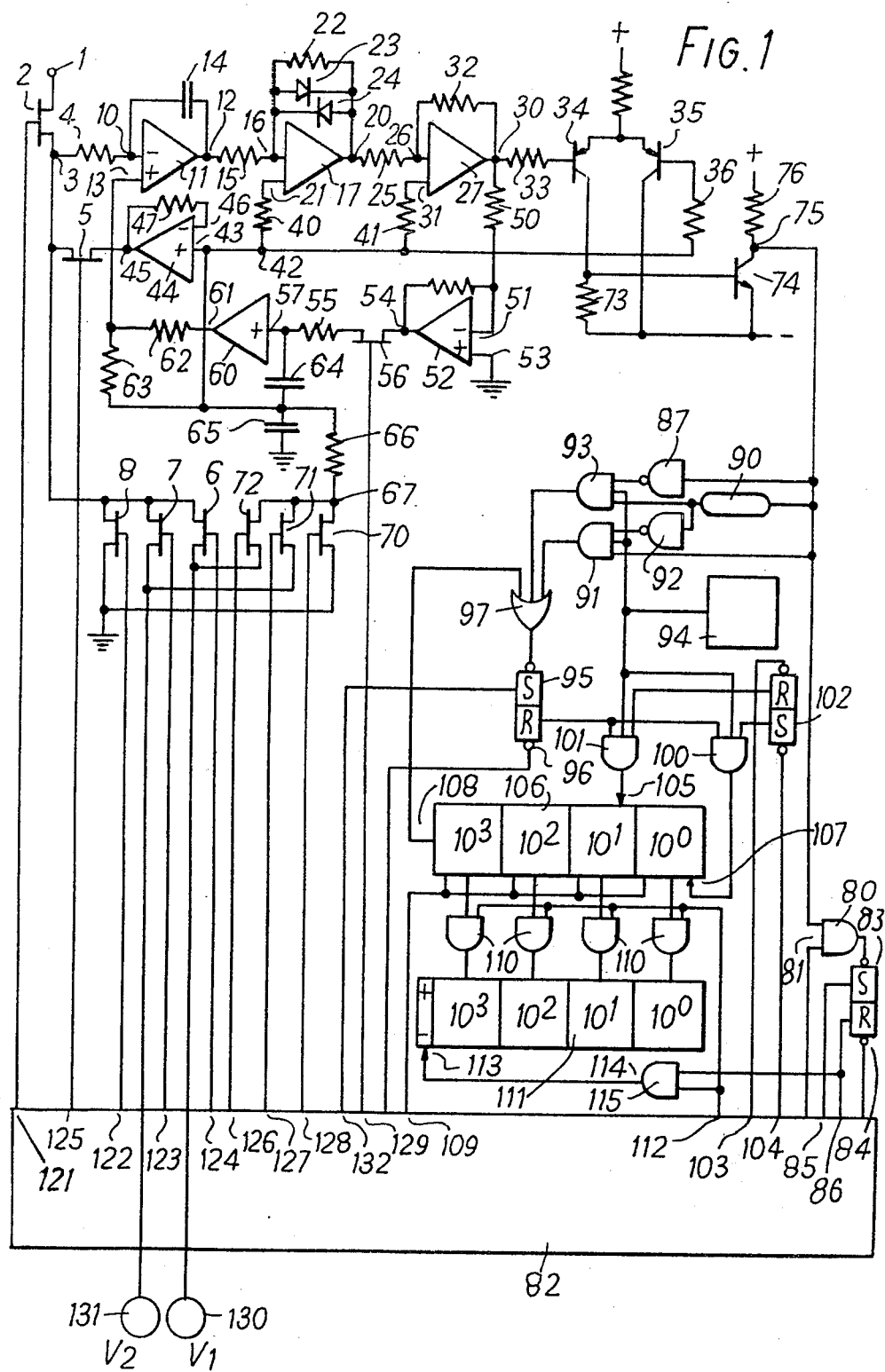

United States Patent [19]
Dorey et al.

[11] 3,942,174
[45] Mar. 2, 1976

[54] BIPOLAR MULTIPLE RAMP DIGITISERS

[75] Inventors: Howard Anthony Dorey, Godalming; Geoffrey Arthur Luckhurst, Farnborough, both of England

[73] Assignee: The Solartron Electronic Group Limited, Farnborough, England

[22] Filed: Dec. 21, 1973

[21] Appl. No.: 427,187

[30] Foreign Application Priority Data
Dec. 22, 1972  United Kingdom............... 59362/72

[52] U.S. Cl. ... 340/347 NT; 340/347 AD; 324/99 D
[51] Int. Cl.²....................................... H03K 13/02
[58] Field of Search............... 340/347 NT, 347 AD; 324/99 D

[56]         References Cited
         UNITED STATES PATENTS

| | | | |
|---|---|---|---|
| 3,368,149 | 2/1968 | Wasserman | 340/347 NT |
| 3,541,446 | 11/1970 | Prozeller | 324/99 D |
| 3,566,397 | 2/1971 | Walton | 324/99 D |
| 3,582,939 | 6/1971 | Campbell | 340/347 DA |
| 3,582,947 | 6/1971 | Harrison | 340/347 NT |
| 3,660,834 | 5/1972 | Picot | 340/347 NT |
| 3,665,457 | 5/1972 | Wheable | 340/347 NT |
| 3,667,055 | 5/1972 | Uchida | 340/347 NT |
| 3,678,506 | 7/1972 | Wheable | 340/347 NT |
| 3,703,002 | 11/1972 | VanSaun | 340/347 AD |
| 3,710,374 | 1/1973 | Kelly | 340/347 NT |
| 3,718,923 | 2/1973 | Horwitz et al. | 340/347 NT |
| 3,737,892 | 6/1973 | Dorey | 340/347 NT |
| 3,786,350 | 1/1974 | Munt | 324/99 D |

OTHER PUBLICATIONS
Buhler, "Logic Controlled Analog Amplifier," IBM Technical Disclosure Bulletin, 8/1973, Vol. 16, No. 3.

*Primary Examiner*—Thomas J. Sloyan
*Attorney, Agent, or Firm*—William R. Sherman; Stewart F. Moore

[57]         ABSTRACT

Electronic analogue to digital converters of the integrating type wherein a capacitor is successively charged by an input signal and discharged by a reference signal, the time required for discharge serving as a measure of the amplitude of the input signal.

6 Claims, 3 Drawing Figures

BIPOLAR MULTIPLE RAMP DIGITISERS

The invention provides a converter wherein the integrator has differential inputs and control means applies the input signal to the same one of the inputs of the integrator, irrespective of polarity, and applies the reference signal to the same input as the signal if the signal is of opposite polarity to the reference signal, and applies the reference signal to the other input if the signal is of the same polarity as the reference signal.

The invention has application in measuring positive or negative input signals whilst employing a single principal reference signal and may be used advantageously in digital voltmeters for making d.c. measurements in the presence of interference.

This invention relates to analogue to digital converters of the integrating type and is particularly, but not exclusively, concerned with the use of such analogue to digital converters in digital voltmeters.

This class of converters includes "dual ramp" converters which are now widely known and used and whereof a description in the context of current state of the art is to be found, for example, at page 227 et seq of "Electronic Measurements and Instrumentation" published by the McGraw Hill book company. It also includes "triple ramp" voltmeters such as are described in our U.S. Pat. Specification No. 3678506 and it will be understood that in principle a larger number of ramps might be employed.

Known converters of this class typically provide, for the measurement of signals of either polarity, dual reference sources of equal voltage but opposite polarity; it is an object of the invention to avoid the need for such dual equal reference sources and the expense associated therewith.

According to the invention, an analogue to digital converter of the integrating type for providing a digital output signal representative of the magnitude of an analogue input signal comprises an input terminal for receiving an input signal, an integrating capacitor, a charging circuit having first and second inputs and arranged to supply a charging current to the integrating capacitor, the polarity of the charging current being the same as that of a signal applied to said first input and opposite to that of a signal applied to said second input, polarity testing means arranged to receive a signal representative of the input signal for testing the polarity of the input signal and providing an output signal representative of said polarity, a source of at least one reference signal, first switch means for establishing a signal path between the input terminal and a predetermined one of said inputs of the charging circuit, second switch means responsive to the signal representative of polarity for establishing a signal path between the source of reference voltage and said predetermined input of the charging circuit if the input signal and the reference signal are of different polarity and for establishing a signal path between the source of reference voltage and the other input of the charging circuit if the input signal and the reference signal are of the same polarity, so that the charge acquired by the capacitor from the charging circuit during application of the input signal is dependent upon the magnitude of the input signal and is discharged by the application of the reference signal, clock pulse generator means and, pulse counting means for counting clock pulses during the application of the reference signal so as to provide digital output signal representative of the magnitude of the input signal.

The invention will now be described by way of non-limitative example with reference to the accompanying drawings in which FIG. 1 is a block circuit diagram of a digital voltmeter in accordance with the invention.

Figure 2A:
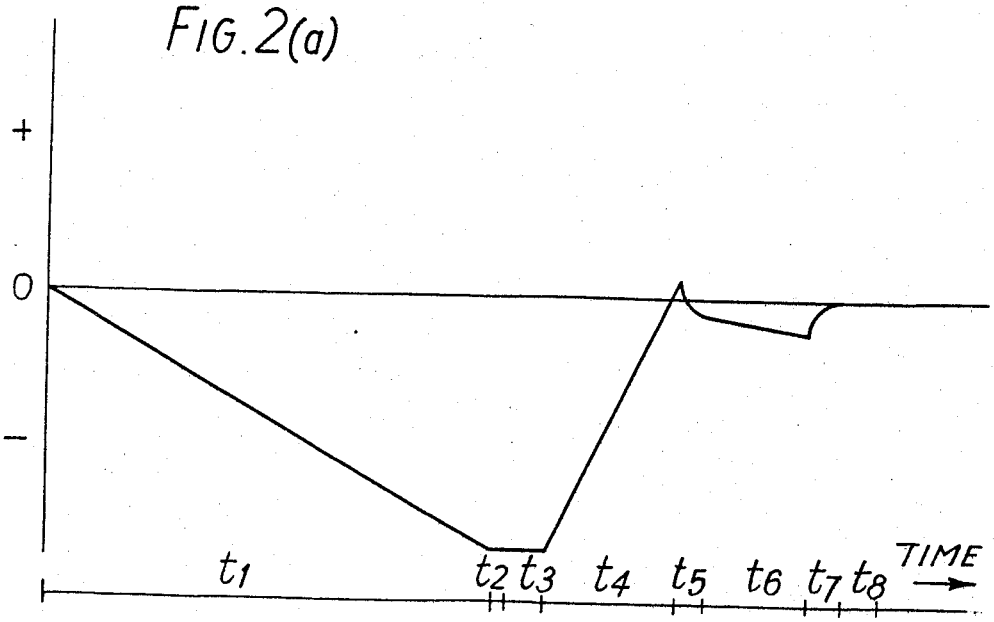
Figure 2B:
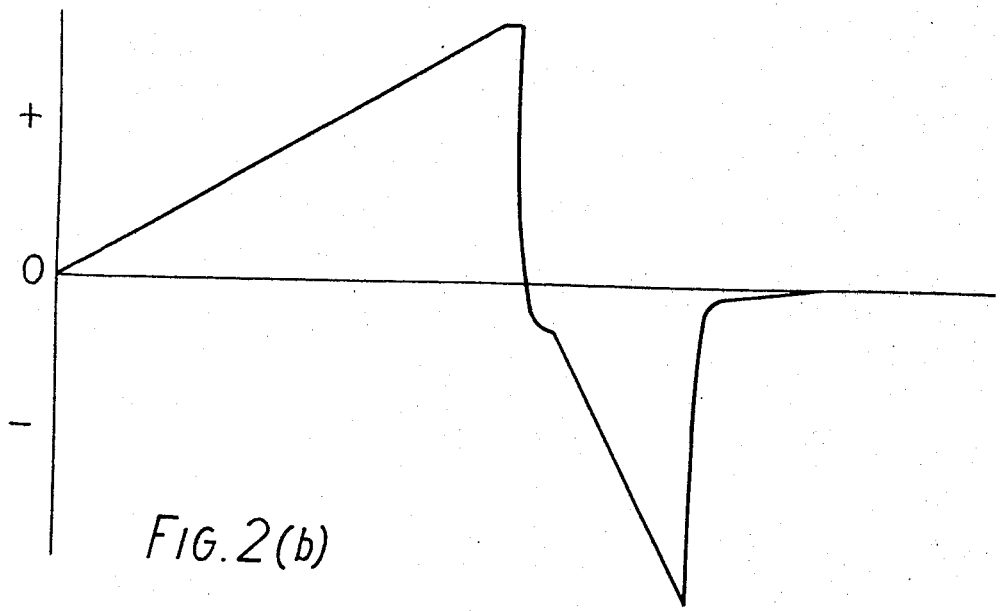

FIGS. 2(a) and 2(b) show the voltage waveform at a point in the circuit of FIG. 1 under different operating conditions of the circuit.

Referring now to FIG. 1, an input point 1 is connected through a solid state switch 2 to a circuit point 3 which in turn is connected to switches 5, 6, 7 and 8 and to an integrating amplifier comprising resistor 4 connected to the inverting input 10 of a differential amplifier 11 having an output 12 and a non-inverting input 13 with a capacitor 14 connected between the output 12 and the inverting input 10.

The output 12 is connected through a resistance 15 to the inverting input 16 of a differential amplifier 17 which has an output terminal 20 and a non-inverting input 21. A resistance 22 and two oppositely directed diodes 23 and 24 are connected in parallel with each other between the output 20 and the inverting input 16, so that amplifier 17 acts as a limiting amplifier.

The output 20 is connected through resistance 25 to the inverting input 26 of differential amplifier 27 which has an output 30 and a non-inverting input 31.

The output 30 is connected through a feedback resistance 32 to the inverting input 26 so that the amplifier 27 provides further gain. The output 30 is also connected through a resistance 33 to the base of transistor 34 which is connected with transistor 35 in long-tailed pair configuration.

The non-inverting inputs 21 and 31 of amplifiers 17 and 27 respectively are connected through resistances 40 and 41 to a common circuit point 42. Resistance 36 is connected between circuit point 42 and the base of transistor 35.

Circuit point 42 is connected to the non-inverting input 43 of amplifier 44 which has an output 45 and an inverting input 46 connected through resistance 47 to output 45 in voltage-follower configuration. The output 45 of amplifier 44 is connected via switch 5 to circuit point 3.

The output 30 of amplifier 27 is also connected through resistance 50 to the inverting input 51 of an amplifier 52 the non-inverting input 53 of which is connected to ground. The output 54 of amplifier 52 is connected through switch 56 and a resistance 55 to the non-inverting input 57 of an amplifier 60. The output 61 of amplifier 60 is connected to a potential divider formed by resistances 62 and 63 in series, the common junction of these resistances being connected to the non-inverting input 13 of amplifier 11 and the other terminal of resistance 63 being connected to circuit point 42. A capacitor 64 is connected between point 42 and the input 57 of amplifier 60 and another capacitor 65 is connected between circuit point 42 and ground.

A resistance 66 is connected between point 42 and a common junction 67 of three switches 70, 71 and 72.

The collector of transistor 34 is connected to a load resistance 73 and to the base of transistor 74. Transistor 74 has a collector 75 to which is connected a load resistance 76.

It will be appreciated that the amplifier 11 together with its input resistor 4 and capacitor 14 constitutes an integrator which will integrate signals appearing between circuit point 3 and the non-inverting input 13. Amplifiers 17 and 27 and the transistor pair 34 and 35 constitute a comparator responsive to differences of potential between the output 12 of the integrator 11 and the common circuit point 42.

Amplifiers 52 and 60 and their associated components and switches provide a feedback loop for correction of drift. Amplifier 44 with switch 5 provides a means of impressing on circuit point 3 any voltage change at circuit point 42.

The collector 75 of transistor 74 is connected to one input of an AND-gate 80, another input 81 of which is connected to a sequence controller 82. The output of the AND-gate 80 is connected to the set input of bistable 83, the reset input 84 of which is connected to the sequence controller 82. Signals from the set and reset outputs of bistable 83 at circuit points 85 and 86 respectively are also connected to the sequence controller 82 to provide, as will be seen, signals representative of the polarity of the input signal for control of the measurement cycle.

The collector 75 is also connected to the respective inputs of an inverter 87, and a delay 90, and to one input of a 3 input AND-gate 91. The output of delay 90 is connected to inverter 92 and to one input of a 3-input AND-gate 93, another input of which is connected to the output of inverter 87. The output of a clock pulse generator 94 is connected to inputs of gates 91 and 93; the third gate of gate 91 is connected to the output of inverter 92. The delay introduced by delay 90 is longer than the period between successive pulses from clock pulse generator 94, so it will be seen that when the level at the output of the comparator, that is to say at collector 75, changes from 0 to 1 or from 1 to 0 a signal will appear at the output of gate 91 or gate 93 respectively, with the occurrence of the first clock pulse after the change.

The outputs of AND-gates 91 and 93 are connected respectively to two inputs of a 3-input OR-gate 97 the output of which is connected to the set input of bistable 95. The reset input 96 of bistable 95 is connected to the sequence controller 82. The set output of bistable 95 is connected to the sequence controller at point 132 and the reset output is connected to one input of a 3-input AND-gate 100 and also to one input of 3-input AND-gate 101. A second input of gate 100 and a second input of gate 101 are connected to receive pulses from clock pulse generator 94 and the third inputs of gates 100 and 101 are connected respectively to the set and reset outputs of a bistable 102. Bistable 102 is set and reset by signals on control lines 104 and 103 respectively from sequence controller 82.

The output of gate 101 is connected to a terminal 105 of a counter 106. Counter 106 is a bi-directional counter having four decade stages in cascade and arranged to count up by increments of 10 in response to pulses at a terminal 105 of least-significant-but-one decade and to count down units in response to pulses at a terminal 107 of the least significant decade. When the counter 106 has reached its full complement, 9999, the next pulse at terminal 105 causes a carry pulse to appear at a "carry" terminal 108 and the contents of the counter are re-set to 0000. The counter may also be reset to 0000 by a pulse from the sequence controller 82 on a control line 109.

The carry output at terminal 108 is connected to the third input of three input OR-gate 97. Individual decade stages within the counter are connected in known fashion through AND-gates 110 (not all shown, in interests of clarity) to a staticiser register decoder and display unit 111. The gates 110 are also all connected to receive a signal from the sequence controller 82 on control line 112 so that a signal on 112 opens the gate to allow parallel transfer of the contents of counter 106 into the staticiser register 111.

A polarity staticiser and display 113, for displaying the polarity of the input signal, is connected to the output 114 of a two input AND-gate 115, the inputs whereof are respectively connected to control line 112 and the reset output 86 of bistable 83.

It will be appreciated that sequence controller 82 not only holds the logic for progressing from one phase of the measurement cycle to the next, as will be described, but also for providing signals to open and close gates and to set and reset bistables etc. during these various phases of the cycle. Accordingly, control signals are provided by the sequence controller 82 to the various switches as follows:

to switch 2 on control line 121
to switch 8 on 122
to switch 7 on 123
to switch 6 on 124
to switch 5 on 125
to switch 72 on 126
to switch 71 on 127
to switch 70 on 128
to switch 56 on 129

One pole of each of switches 6, 7 and 8 is connected to the common point 3; the other poles are connected respectively to a first source of negative reference voltage $V_1$ at point 130, to a second source of negative reference voltage $V_2$ at point 131, and to ground. The magnitude of $V_1$ is ten times that of $V_2$.

Switches 70, 71 and 72 similarly each have one pole connected to common point 67 and their other poles connected respectively to ground, to the second reference voltage at point 131 and to the first reference voltage at point 130.

It will be appreciated that although the symbol for a junction transistor is shown for switches 2, 6, 7 etc., insulated gate or bipolar transistors or other suitable switches, not excluding mechanical switches, may be selected for each application according to the performance required and the preferred manufacturing technology.

The operation of the voltmeter will now be described with reference to both FIGS. 1 and 2. In the interests of clarity the horizontal axis or time base of the FIG. 2 is highly non-linear and has been expanded in respect of the intervals shown as $t_2$, $t_3$ in relation to periods $t_1$, $t_4$ and $t_6$.

The measurement cycle comprises 8 well defined phases each marked by signals from the sequence controller 82. Immediately before the beginning of the measurement cycle switches 8 and 70 are closed by means of potentials applied by the sequence controller on lines 122 and 128 respectively but all other switches are open. Bistables 102 and 83 have been re-set by means of signals at 103 and 84, bistable 95 has been set at the end of the previous cycle.

At the beginning of the first phase the sequence controller 82 provides a signal on line 96 to re-set bistable 95 and, at point 121, to close switch 2. Simultaneously the enabling signal on line 122 holding switch 8 closed is removed so the point 3 is now connected to the input signal. Pulses from clock pulse generator 94 pass through gate 101, enabled by the re-setting of bistables 102 and 95, into terminal 105 of counter 106.

This state will continue until a carry bit at terminal 108 passing through OR gate 97 sets bistable 95 thereby removing one of the enabling signals at gate 101. At the same time the change at point 132 passes to the sequence controller marking the end of phase 1. The enabling signal is removed from point 121 and restored to point 122, thereby opening switch 2 and closing switch 8 to connect the input point 3 to ground.

By a suitable choice of frequency of clock pulse generator 94 and the 'full house' count of counter 106, phase 1 may be made a convenient period, for example 100 milliseconds.

During the first phase an input signal applied to terminal 1 is integrated for a fixed period of time to charge capacitor 14. At the end of the first phase the polarity of this charge is tested in order to determine the polarity of the input signal; thereafter the way in which reference potentials are applied to the integrator to discharge the capacitor 14 depends upon the polarity of the input signal. Consider first the measurement of a positive signal applied to point 1 and refer to FIG. 2(a) where phase 1 is marked by the time interval $t_1$ during which the output of the integrator ramps negatively in response to the positive input signal at point 1.

The second phase is a short time interval, $t_2$, to allow any transients to settle. At the end of period $t_2$ the polarity at the output of the comparator, point 75, is tested by an enabling signal from the sequence controller at point 81 so that if the output of gate 80 is 1 the bistable 83 will be set, but if it was 0 the bistable 83 will remain re-set. It will be seen that a positive input signal at point 1 will provide a 0 at point 75 and so leave the bistable 83 re-set.

A third timed interval $t_3$, is provided immediately after $t_2$ but in the case of a positive input signal, no further switching takes place until the beginning of the next phase $t_4$.

At the beginning of interval $t_4$ the enabling voltage is removed by the sequence controller from point 122 and applied instead to point 124 thereby opening switch 8 and closing switch 6. At the same time enabling voltage is restored to point 96 to re-set bistable 95 and once again admit clock pulses from clock pulse generator 94 through gate 101 and terminal 105 into the counter 106.

The application of the negative voltage $V_1$ at point 130 to the input 3 causes the output of the integrator at point 12 to start to ramp back towards zero as shown in FIG. 2(a). As the output of the integrator passes through zero the voltage at point 75 changes from 0 to 1. The signal at the output of delay 90, inverted by inverter 92, will remain positive for a short time after the change so that, with the next pulse from clock pulse generator 94, all three inputs to gate 91 are enabled and an output signal sets bistable 95. This removes the enabling signal from gate 101, and a signal from the set output of bistable 95 to the sequence controller at 132 disables the signal at point 124 to open switch 6, and provides signals at points 125, to close switch 5, to point 127, to close switch 71 and to point 103 to set bistable 102. A further time delay $t_5$, equal in length to delay $t_3$, is initiated.

Application of the second negative reference voltage $V_2$ through the switch 71 to point 67 causes the potential at point 42 to approach exponentially the value $V_2$ as a result of the filtering action of resistance 66 and capacitor 65. Further, the voltage change at point 42 is impressed on the input circuit point 3 by means of the voltage follower 44 through the switch 5. As a result of this filtering action, the rate of change of voltage applied to the two differential inputs of amplifier 11 is reduced so that there is no change in the charge on the capacitor 14 as a result of the change in level of the input point 13 from ground to that of the negative reference voltage. The period $t_5$ must be much longer than the time constant of the filter formed by resistance 66 and capacitance 65 to allow the potential at point 13 substantially to reach that of point 131. Because the change in potential has been applied to the non-inverting input 13 of amplifier 11 as well as to common point 3 there will be a change in the output of the integrator 11 at point 12 following that applied to point 13; this is illustrated in FIG. 2(a). At the time it will be noted that the non-inverting input of the comparator at point 21 has also been changed by the same amount equal to the second negative reference voltage so that the comparator will still change state when the voltage across capacitor 14 passes through zero.

During the sixth phase of the measurement cycle the enabling voltage is removed by the sequence controller from the point 125 and applied to point 122, thereby connecting point 3 to ground. At the same time a signal to point 96 re-sets bistable 95. Since bistable 102 has been set, clock pulses will pass through gate 100 into the 'units' stage of counter 106 for subtraction from the number, an integral count of tens, counted up during the fourth phase. It will be appreciated that the relative significance accorded to clock pulses during the fourth and sixth phases corresponds to the relative magnitude of $V_1$ and $V_2$. Because the circuit point 3 is now positive with respect to the non-inverting input 13 of amplifier 11, the output of the integrator at point 12 will now ramp negatively until it reaches a value $-V_2$ at which point the comparator will signal a voltage change from positive to negative. This will provide a 1 at the output of inverter 87, a delayed 1 at the output of delay 90 and accordingly gate 93 will open on the next clock pulse from clock pulse generator 94 passing through AND gate 97 to set bistable 95. This removes the enabling voltage from gate 100 and so stops the flow of clock pulses to counter 106.

The number in counter 106 is dependent upon the time taken to discharge completely the charge acquired by capacitor 14 from the input signal to be measured at point 1 during the timed period of phase 1.

A signal from the set output 132 of bistable 95 into the sequence controller marks the transition from period $t_6$ to $t_7$. The enabling voltage is removed from point 127 and applied to point 128 so that point 67 is now grounded and point 42 returns at a rate limited by resistance 66 and capacitor 65 towards ground. At the same time the enabling voltage on point 122 is removed and transferred to point 125 thereby impressing the change of voltage at circuit point 42 on the circuit point 3 so as to avoid a potential between the inverting and non-inverting inputs of amplifier 11 during the transition.

During the interval of $t_7$ the contents of counter 106 are transferred into a staticiser register 111 by means of an enabling signal at point 112 applied to gates 110.

The same signal at 112 opens gate 115 if bistable 83 was re-set, thereby entering a plus sign in staticiser 113 if the input signal was positive.

At the end of period $t_7$, which is of the same duration as $t_3$ and $t_5$, the counter 106 is restored to zero by signal from the sequence controller on line 109.

The final stage in the cycle is phase 8, drift correction, wherein the enabling voltage is removed from point 125 and transferred to point 122, thereby grounding circuit point 3; at the same time an enabling voltage is applied to point 129 to close switch 56 so that any voltage at the input of amplifier 52 is amplified, inverted and applied through resistance 55 to capacitor 64. Amplifier 60 presents a high input impedance to capacitor 64 so that its output remains constant during the following cycle. A proportion of the output voltage from amplifier 60 appears across resistance 63 and is applied to the non-inverting input of amplifier 11. It will be seen that the action of the drift correction loop is to sample the voltage at point 30 during each cycle and to charge the capacitor 64 so as to counteract the drift at point 30.

The operation of the embodiment of FIG. 1 in measuring a negative voltage will now be explained with reference to FIG. 2(b). During phase 1, for period $t_1$ the input signal is applied, as already described, to circuit point 3 by closing switch 2 so that the output of the integrator ramps positively in response to the negative input signal. A brief period $t_2$ follows $t_1$ during which circuit point 3 is connected to ground through switch 8. After $t_2$ the polarity at the output of the integrator is tested by applying an enabling voltage from a sequence controller to gate 80 at point 81. Since the output of the comparator at point 75 is also 1, the bistable 83 will be set and a signal from the set output 85 to the sequence controller will dictate the switching operation during periods $t_3$, $t_4$, $t_5$, $t_6$ and $t_7$ which differ from those in measuring a positive input signal.

At the beginning of period $t_3$ enabling signals are applied on lines 126 and 125 by the sequence controller to close switches 72 and 5 and removed from lines 128 and 122 to open switches 70 and 8. The first negative reference voltage $V_1$ at point 130 is impressed through the filter formed by resistance 66 and capacitor 65 onto circuit point 42 and thence through amplifier 44 and switch 5 onto circuit point 3; both the inverting input 10 and non-inverting input 13 of amplifier 11 slew towards $-V_1$, substantially reaching this potential before the end of period $t_3$. This imposes a corresponding change on the output voltage at point 12 of integrator 11 as shown in FIG. 2(b).

At the beginning of period $t_4$ the circuit point 3 is disconnected from the output of amplifier 44, and connected to ground by removal of the enabling voltage from point 125 and applying it instead to point 122 to close switch 8. The circuit point 3 is now positive with respect to the non-inverting input 13 of amplifier 11 by an amount equal to the first reference voltage so that the output of the integrator starts to ramp negatively at point 12. As the voltage at point 12 passes through a level equal to $-V_1$ the comparator, the non-inverting input of which is also connected at point 42 to $-V_1$ changes over and a signal appears at the output of gate 93 coincident with the first clock pulse after the comparator changes. The signal appearing at the output of gate 93 passes through gate 97 to set bistable 95 and close gate 101.

Unless the changeover of the comparator at point 75 was exactly coincident with a clock pulse from clock pulse generator 94, the negative-going ramp at the output of integrator 12 will slightly have overshot the point of zero potential across capacitor 14 and must now be restored to its starting point by application of a reference signal in the opposite sense.

The end of phase 4 is marked by the signal from bistable 95 at point 132 to sequence controller 82, whereupon the enabling signal is transferred from line 126 to line 128 to connect circuit point 67 to ground via switch 70 from line 122 to line 125, closing switch 5 so that circuit point 3 follows circuit point 42 in returning to ground potential. At the end of period $t_5$ circuit point 42 is at ground potential and the output of the integrator at point 12 represents the "overshoot." This is removed during phase 6 by the application of the second reference potential $V_2$ through gate 7 to circuit point 3; sequence controller transfers the enabling signal from point 125 to point 123 to close gate 7. At the same time, during phase 6, the bistables 102 and 95 are set thereby directing clock pulses through gate 100, into the units count-down terminal 107 of counter 106. The end of phase 6 is marked by transition at the output of comparator, point 75, from 0 to 1 thereby opening gate 91 on the first clock pulse thereafter and setting bistable 95 to close gate 100.

At this point the contents of the counter are again dependent on the time required to discharge completely the charge acquired from the input signal by capacitor 14 and this number will be transferred to the staticiser and display 111 during the next stage as previously described. The resetting and drift correction follow the same course already described as those following application of a positive input voltage.

We claim:

1. An integrating analogue-to-digital converter for producing a digital output signal representative of the magnitude of an analogue input signal, the converter comprising:

an input terminal for receiving the analogue input signal;

integrating means comprising a differential amplifier having an inverting input, a non-inverting input and an output, and an integrating capacitance negative-feedback connected between said output and said inverting input;

first switch means for coupling the input terminal to a predetermined input of the differential amplifier during a first time interval, whereby the capacitance is charged to a voltage whose magnitude and polarity are dependent upon the magnitude and polarity of the analogue input signal;

polarity testing means arranged to receive a signal representative of the voltage across said capacitance and responsive thereto to produce an output signal having a first level representative of one polarity of the voltage across the capacitance and a second level representative of the other polarity of the voltage across the capacitance;

a source of at least one reference voltage;

second switch means responsive to the output signal produced by the polarity testing means at the end of the first time interval to couple the reference voltage source to said predetermined input of the differential amplifier if the analogue input signal and the reference voltage are of different polarity, whereby to discharge the capacitance, and to couple the reference voltage source to the other input of the differential amplifier and temporarily to said predetermined input if the analogue input signal and the reference voltage are of the same polarity, whereby to slew the respective voltages at both inputs and the output of the differential amplifier by an amount equal to the reference voltage, while preserving the voltage across the capacitance substantially unchanged, and to subsequently discharge the capacitance, the discharging of the capacitance taking place, in either case, during a second time interval whose end is indicated by a change in the output signal produced by the polarity testing means from one level to the other;

a source of clock pulses; and pulse counter means arranged to count clock pulses during the second time interval, whereby to produce a digital output signal representative of the magnitude of the analogue input signal.

2. A converter as claimed in claim 1, wherein the integrating means further comprises an input resistance connected to the inverting input of the differential amplifier, and wherein the first switch means is arranged to couple the analogue input signal to said inverting input via said input resistance, whereby said inverting input constitutes said predetermined input.

3. A converter as claimed in claim 2, wherein the second switch means includes a voltage follower amplifier for effecting said temporary coupling of the reference voltage source to the inverting input of the differential amplifier, said temporary coupling being effected via said input resistance.

4. A converter as claimed in claim 3, further comprising a low pass filter connected in series between the reference voltage source and both the non-inverting input of the differential amplifier and the voltage follower amplifier, whereby the rate of change of voltage at the respective inputs of the differential amplifier in response to a step voltage change at the input of the filter does not exceed the maximum slew rate of the differential amplifier.

5. A converter as claimed in claim 1, further comprising timing means connected to control the first switch means so as to couple the input terminal to said predetermined input of the differential amplifier for a time interval of substantially predetermined duration.

6. A converter as claimed in claim 2, wherein the polarity testing means comprises a voltage comparator having first and second inputs respectively coupled to the non-inverting input and the output of the differential amplifier.

* * * * *